(12) United States Patent
Bell et al.

(10) Patent No.: US 7,426,835 B2
(45) Date of Patent: Sep. 23, 2008

(54) THERMOELECTRIC PERSONAL ENVIRONMENT APPLIANCE

(75) Inventors: Lon E. Bell, Altadena, CA (US); Robert W. Diller, Pasadena, CA (US)

(73) Assignee: BSST, LLC, Irwindale, CA (US)

( * ) Notice: Subject to any disclaimer, the term of this patent is extended or adjusted under 35 U.S.C. 154(b) by 982 days.

(21) Appl. No.: 10/215,163

(22) Filed: Aug. 7, 2002

(65) Prior Publication Data
US 2003/0029173 A1 Feb. 13, 2003

Related U.S. Application Data

(60) Provisional application No. 60/310,565, filed on Aug. 7, 2001.

(51) Int. Cl.
*F25B 21/02* (2006.01)
(52) U.S. Cl. .......................................... 62/3.3; 62/259.3
(58) Field of Classification Search ................ 62/3.2, 62/3.3, 259.3, 238.2, 3.5, 3.7, 314
See application file for complete search history.

(56) References Cited

U.S. PATENT DOCUMENTS

| | | | |
|---|---|---|---|
| 38,128 A * | 4/1863 | Gallup et al. ................. 99/601 |
| 2,944,404 A | 7/1960 | Fritts |
| 2,949,014 A | 8/1960 | Belton, Jr. et al. |
| 3,004,393 A | 10/1961 | Alsing |
| 3,006,979 A | 10/1961 | Rich |
| 3,071,495 A | 1/1963 | Hänlein |
| 3,126,116 A | 4/1964 | Clinehens |
| 3,129,116 A | 4/1964 | Corry |
| 3,178,895 A | 4/1965 | Mole et al. |
| 3,213,630 A | 10/1965 | Mole |
| 3,527,621 A | 9/1970 | Newton |
| 3,607,444 A | 9/1971 | DeBucs |
| 3,626,704 A | 12/1971 | Coe, Jr. |
| 3,635,037 A | 1/1972 | Hubert |
| 3,663,307 A | 5/1972 | Mole |
| 3,681,929 A | 8/1972 | Schering |
| 3,779,814 A | 12/1973 | Miles et al. |
| 3,817,043 A * | 6/1974 | Zoleta ........................ 62/3.61 |
| 4,038,831 A | 8/1977 | Gaudel et al. |
| 4,065,936 A * | 1/1978 | Fenton et al. ................. 62/3.3 |

(Continued)

FOREIGN PATENT DOCUMENTS

GB   2 027 534 A   2/1980

(Continued)

OTHER PUBLICATIONS

International Search Report for PCT/US 02/06285 dated May 11, 2002.

(Continued)

*Primary Examiner*—Mohammad M Ali
(74) *Attorney, Agent, or Firm*—Knobbe, Martens, Olson & Bear LLP

(57) ABSTRACT

A personal environment appliance is disclosed in which a person in a work area can individually control the ambient conditions of that persons localized work space environment. The control permits highly localized adjustment to suit individual preferences, thereby, reducing the impact of individual environmental preferences on the individuals. In addition to environment conditions, a variety of accessories may be provided such as beverage heaters and/or coolers.

10 Claims, 5 Drawing Sheets

U.S. PATENT DOCUMENTS

| | | | |
|---|---|---|---|
| 4,281,516 A | 8/1981 | Berthet et al. | |
| 4,297,841 A | 11/1981 | Cheng | |
| 4,420,940 A | 12/1983 | Buffet | |
| 4,494,380 A | 1/1985 | Cross | |
| 4,499,329 A | 2/1985 | Benicourt et al. | |
| 4,730,459 A | 3/1988 | Schlicklin et al. | |
| 4,731,338 A | 3/1988 | Ralston et al. | |
| 4,905,475 A | 3/1990 | Tuomi | |
| 4,989,626 A | 2/1991 | Takaga et al. | |
| 5,038,569 A | 8/1991 | Shirota et al. | |
| 5,092,129 A | 3/1992 | Bayes et al. | |
| 5,097,829 A | 3/1992 | Quisenberry | |
| 5,193,347 A | 3/1993 | Apisdorf | |
| 5,228,923 A | 7/1993 | Hed | |
| 5,232,516 A | 8/1993 | Hed | |
| 5,385,020 A | 1/1995 | Gwilliam et al. | |
| 5,429,680 A | 7/1995 | Fuschetti | |
| 5,499,504 A * | 3/1996 | Mill et al. | 62/3.3 |
| 5,584,183 A | 12/1996 | Wright et al. | |
| 5,592,363 A | 1/1997 | Atarashi et al. | |
| 5,605,047 A | 2/1997 | Park et al. | |
| 5,682,748 A | 11/1997 | DeViibiss et al. | |
| 5,802,856 A | 9/1998 | Schaper et al. | |
| 5,860,472 A | 1/1999 | Batchelder | |
| 5,867,990 A | 2/1999 | Ghoshal | |
| 5,900,071 A | 5/1999 | Harman | |
| RE36,242 E | 6/1999 | Apisdorf | |
| 5,921,088 A | 7/1999 | Imaizumi et al. | |
| 5,966,941 A | 10/1999 | Ghoshal | |
| 5,987,890 A | 11/1999 | Chiu et al. | |
| 6,000,225 A | 12/1999 | Ghoshal | |
| 6,082,445 A | 7/2000 | Dugan | |
| 6,084,172 A | 7/2000 | Kishi et al. | |
| 6,096,966 A | 8/2000 | Nishimoto et al. | |
| 6,282,907 B1 | 9/2001 | Ghoshal | |
| 6,319,744 B1 | 11/2001 | Hoon et al. | |
| 6,334,311 B1 | 1/2002 | Kim et al. | |
| 6,346,668 B1 | 2/2002 | McGrew | |
| 6,347,521 B1 | 2/2002 | Kadotani et al. | |
| 6,366,832 B2 | 4/2002 | Lomonaco et al. | |
| 6,367,261 B1 | 4/2002 | Marshall et al. | |
| 6,401,462 B1 | 6/2002 | Bielinski | |
| 6,412,287 B1 * | 7/2002 | Hughes et al. | 62/3.61 |
| 6,446,442 B1 | 9/2002 | Bathelor et al. | |
| 6,477,844 B2 * | 11/2002 | Ohkubo et al. | 62/3.7 |
| 6,481,213 B2 * | 11/2002 | Carr et al. | 62/3.2 |
| 6,510,696 B2 * | 1/2003 | Guttman et al. | 62/3.3 |
| 6,530,231 B1 * | 3/2003 | Nagy et al. | 62/3.2 |
| 6,530,842 B1 * | 3/2003 | Wells et al. | 463/46 |
| 6,539,725 B2 | 4/2003 | Bell | |
| 6,560,968 B2 * | 5/2003 | Ko | 62/3.2 |
| 6,598,405 B2 | 7/2003 | Bell | |
| 6,625,990 B2 | 9/2003 | Bell | |
| 6,637,210 B2 | 10/2003 | Bell | |
| 6,672,076 B2 | 1/2004 | Bell | |
| 2002/0014261 A1 | 2/2002 | Caillat et al. | |
| 2002/0139123 A1 * | 10/2002 | Bell | |
| 2002/0148234 A1 * | 10/2002 | Bell | |
| 2003/0079770 A1 | 5/2003 | Bell | |
| 2003/0094265 A1 | 5/2003 | Chu et al. | |

FOREIGN PATENT DOCUMENTS

| | | | |
|---|---|---|---|
| GB | 2 027 634 A | | 2/1980 |
| GB | 2267338 A | * | 12/1993 |
| JP | 56-18231 | | 2/1981 |
| JP | 356018231 A | * | 2/1981 |
| JP | 4-165234 | | 6/1992 |
| JP | 5-219765 A | | 8/1993 |
| JP | 05219765 A | | 8/1993 |
| SE | 329 870 | | 5/1969 |
| SE | 337 227 | | 8/1971 |
| WO | PCT/US02/03654 | | 5/2002 |
| WO | PCT/US02/03659 | | 7/2002 |
| WO | PCT/US02/03772 | | 7/2002 |
| WO | WO 02/065030 A1 | | 8/2002 |
| WO | PCT/US03/17834 | | 7/2003 |
| WO | PCT/US03/24899 | | 8/2003 |
| WO | PCT/US2004/026757 | | 3/2005 |

OTHER PUBLICATIONS

International Search Report for PCT/US 02/25233 dated Sep. 24, 2002.
A New Concept for Improving Thermoelectric Heat Pump Efficiency, R.J. Buist, J.W. Fenton and J.S. Lee, Borg-Warner Thermoelectrics Wolf and Algonquin Road.
Tada, Shigeru, et al., A New Concept of Porous thermoelectric Module Using a Reciprocating Flow for Cooling/Heating System (Numerical Analysis for Heating System), 16th International Conference on Thermoelectrics (1997).
Goldsmid, H.J., *Electronic Refrigeration*, Pion Ltd., 207 Brondesbury Park, London (1986).
Angrist, Stanley W., *Direct Energy Conversion*, 32 Ed. Ally & Bacon (1976).
Miner, A., Majumdar, A., and U. Ghoshal, Thermo-Electro-Mechanical Refrigeration Based on Transient Thermoelectric Effects, Applied Physics letters, vol. 75, pp. 1176-1178 (1999).
Buist, R. and Lau, P., Theoretical Analysis of Thermoelectric Cooling Performance Enhancement Via Thermal and Electrical Pulsing, Journal of Thermoelectricity, No. 4, 1996.
Copending U.S. Appl. No. 09/844,818, filed Apr. 27, 2001 and pending claims.
Copending U.S. Appl. No. 09/860,725, filed May 18, 2001 and pending claims.
Copending U.S. Appl. No. 09/987,232, filed Nov. 6, 2001 and pending claims.
Copending U.S. Appl. No. 10/164,656, filed Jun. 6, 2002 and pending claims.
Co-pending U.S. Appl. No. 09/918,999, filed Jul. 31, 2001, Bell (and pending claims).
Co-pending U.S. Appl. No. 10/074,543, filed Feb. 11, 2002, Bell (and pending claims).
Co-pending U.S. Appl. No. 10/227,398, filed Aug. 23, 2002, Bell (and pending claims).
Co-pending U.S. Appl. No. 10/405,001, filed Mar. 31, 2003, Bell (and pending claims).
Co-pending U.S. Appl. No. 10/632,235, filed Jul. 31, 2002, Bell (and pending claims).
Co-pending U.S. Appl. No. 10/642,773, filed Aug. 18, 2003, Bell (and pending claims).
Co-pending U.S. Appl. No. 10/897,292, filed Jul. 22, 2004, Bell (and pending claims).
Co-pending U.S. Appl. No. 10/642,980, filed Aug. 18, 2003, Bell (and pending claims).
Co-pending U.S. Appl. No. 10/405,001, filed Mar. 31, 2003.
Co-pending U.S. Appl. No. 10/642,773, filed Aug. 12, 2003.
Co-pending U.S. Appl. No. 10/897,292, filed Jul. 22, 2004.
Co-pending U.S. Appl. No. 10/642,980, filed Aug. 18, 2003.
Bell, L.E., "Use of Thermal Isolation to Improve Thermoelectric System Operating Efficiency," Proc. 21st Int'l Conf. on Thermoelectrics, Long Beach, CA (Aug. 2002).
Bell, L.E., "Increased Thermoelectric System Thermodynamic Efficiency by Use of Convective Heat Transport," Proc. 21st Int'l Conf. on Thermoelectrics, Long Beach, CA (Aug. 2002).
Ikoma, K., et al., "Thermoelectric Module and Generator for Gasoline Engine Vehicles," 17th Int'l Conf. on Thermo-electrics, Nagoya, Japan, pp. 464-467 (1998).
*CRC Handbook of Thermoelectrics*, ed. D.M. Rowe, Chapter 54, *Medium-Scale Cooling: Thermoelectric Module Technology*, Jul. 1995, ISBN: 0-8493-0146-7.

* cited by examiner

THERMOELECTRIC PERSONAL ENVIRONMENT APPLIANCE

REFERENCE TO PRIOR PROVISIONAL APPLICATION

This Application is related to and claims the benefit of the filing date of prior filed U.S. Provisional Patent Application No. 60/310,565, filed Aug. 7, 2001.

BACKGROUND OF THE INVENTION

1. Field of the Invention

The present invention relates to heating and air conditioning and, more particularly, is concerned with providing localized thermal comfort in the workplace. In addition, the invention can also be applied in many circumstances in living areas of homes and apartments. The deployment and use of the invention is similar to that in the workplace, being focused on individual localized comfort.

2. Description of the Related Art

Generally, where work places or dwelling are climate controlled, the climate control is provided by large compressor-based systems to large zones encompassing many individual work areas. This situation results in high costs of conditioning the spaces not occupied and also forces within a single controlled zone to accept that climate output whether or not it satisfies an individual's preference or sense of comfort. Further, such control over large zones is not uniform, so that some present are exposed to areas that are hot while others are too cold.

Compressor-based systems for individual climate control are impractical because of their size, cost, and noise output. Others have addressed the need for individual climate control using thermoelectric devices. For example U.S. Pat. No. 5,193,347 discloses a helmet with a thermoelectric cooler supplying a cool breeze to the face of the wearer. Such systems are not suitable for most practical work or dwelling situations. Another example is the system described in U.S. Pat. No. 4,905,475. In its description, the patent presents a system with airflow directed to the head and neck of the individual, and with only rudimentary control over the air temperature produced. Many workers, particularly those with sedentary jobs, have a need for more individualized climate control using an appliance not so intimately and closely coupled to their person as are present systems.

SUMMARY OF THE INVENTION

With appropriate technology, providing individual localized area climate control requires a small power input to achieve easily discernible effects on the individual. Zonal climate control temperatures may be adjusted to reduce the power required for overall space climate control and individual localized area climate control appliances used to fine-tune the environment for each individual. Overall, such systems will save energy. One example is using thermoelectric devices as described in the present application, which are advantageous because they are small, quiet, and can be quite efficient when employed properly.

Individualized climate control also will increase productivity, not only because the individuals can choose the temperature most comfortable to them, but because they are empowered to make the choice.

Therefore, one aspect of the present invention is to provide localized personal comfort to individuals with a range of controllability built into a device that is not intrusive to them or obstructive to their normal work or other environment. Preferably, localized control for the temperature in the proximate vicinity of one or more individuals. This is distinguished from mobile cooling systems, such as individually cooled and heated seats, which more directly cool or heat the seat occupant as opposed to the local environment. Preferably, the local workspace environment is controllable. A further object of this invention is to augment a personal environment appliance with additional features useful to an individual and synergistic with its fundamental design. Such features include localized air filtration, small area lighting, beverage heating/cooling, small personal refrigerator, and calming auditory environment.

The system described herein is generally intended for non-mobile applications, but could be implemented in a mobile environment or workspace or work area setting.

One aspect of the present invention involves a personal environment appliance that provides heating and/or cooling in a localized area, such as a work area. The appliance generally has at least one electric motor driving at least one fan, at least one inlet air path to a low pressure side of the at least one fan, at least one thermoelectric device, at least one main side heat exchanger in thermal communication with the at least one thermoelectric device, wherein inlet air passes the heat exchanger and changes temperature, and at least one outlet for air that has passed the heat exchanger to provide temperature control of the local area.

In one embodiment, the at least one insulative insert is enclosed within a housing and is shaped to provide at least one air pathway. For example, the at least one insulative insert is shaped to form the at least one inlet air path.

In one embodiment, an air filter is provided, preferably demountably so it can be replaced. Preferably, at least one flow directing device is provided for the outlet. In one embodiment, at least one AC to DC power supply is provided to supply electricity to the thermoelectric.

In one embodiment, a user operable control is provided. Preferably, the user operable control adjusts the air flow rate, and/or the amount of heating or cooling, and/or selects cooling, heating, operation of the fan without heating or cooling, and off.

The appliance may be constructed to rest on a surface, to be suspended from a surface, or to be attached to a surface. In one embodiment, the appliance is configured to mount on a computer monitor. In such an embodiment, an anti-glare screen may be provided.

In one embodiment, a light is included, such as a work surface light. In another embodiment, a sound generator is provided. The sound generator may generate white noise or other distraction eliminating, and may also provide active noise cancellation.

In one embodiment, the appliance include a thermoelectric beverage cooler and heater. A holder for desk implements and supplies may also be a part of the appliance.

In another embodiment, a thermoelectric refrigerator may be built into the appliance.

For improved efficiency, preferably, at least some of the at least one thermoelectric devices employ thermal isolation in the direction of flow.

DETAILED DESCRIPTION OF THE PREFERRED EMBODIMENTS

In the context of this description, the term Thermoelectric Module or TE Module are used in the broad sense of their ordinary and accustomed meaning, which is (1) conventional thermoelectric modules, such as those produced by Hi Z Technologies, Inc. of San Diego, California, (2) quantum tunneling converters, (3) thermoionic modules, (4) magneto caloric modules, (5) elements utilizing one, or any by combination of, thermoelectric, magneto caloric, quantum tunneling, and thermoionic effects, and (6) any combination, array, assembly and other structure of (1) through (5) above.

In this description, the words cold, hot, cooler, hotter and the like are relative terms, and do not signify a particular temperature or temperature range. In addition, the embodiments described in this application are merely examples, and are not restrictive to the invention, which is defined in the claims.

Figure 1:
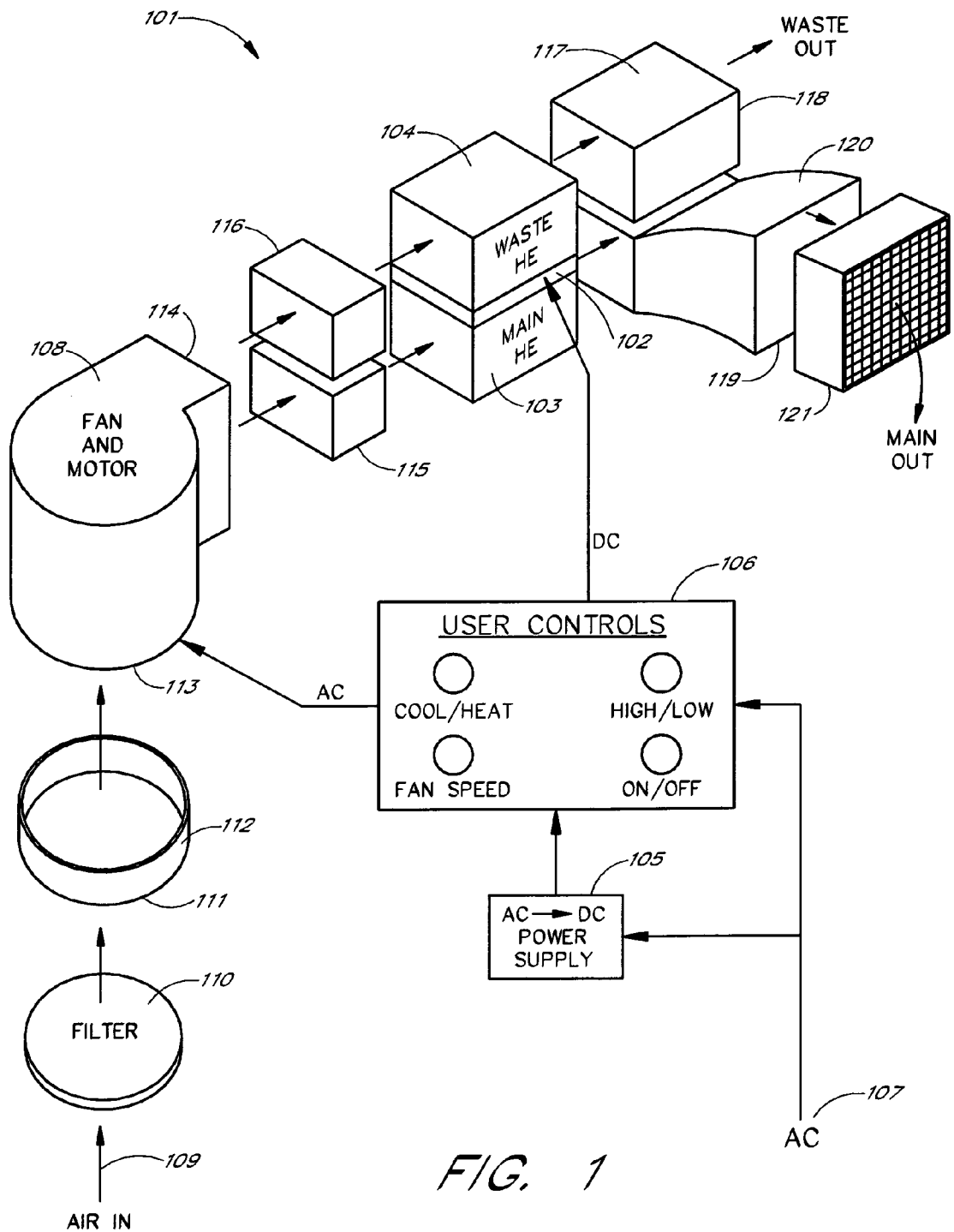
FIG. 1 depicts a schematic diagram of a thermoelectric personal environment appliance.

FIG. 1 is a schematic diagram of a personal environment appliance 101. A thermoelectric module 102 is in good thermal communication with a main side heat exchanger 103 and a waste side heat exchanger 104. The good thermal communication is achieved, for example, using thermal grease or a thermally conductive epoxy. As shown, the heat exchangers 103 and 104 are straight finned heat exchangers although many other types of heat exchangers may be used. DC power is supplied to the TE module 102 by the power supply 105 as selected by the settings (on/off, cool/heat, and high/low) of the user controls 106. The power supply 105 is preferably a switching power supply to maximize efficiency and minimize cost and weight. The power supply 105 may be either internal to the appliance or may be external with suitable electrical cabling connecting the power supply 105 with the user controls 106. The input to the power supply is AC power 107 delivered through a suitable cord and plug (not shown). AC power 107 is also provided though the user controls 106 (on/off and fan speed) to an electric motor driven fan 108. Other sources of power are also acceptable. As shown, the electric motor driven fan is a composed of a single motor and a single fan blade. Depending upon the amount of air flow required and the pressure differential that must be produced, multiple fan blades can be mounted on the shaft or multiple shaft motors can be used. Alternately, two completely separate fan blade and motor assemblies can be used. Although a DC fan could also be used, the fan motor is preferably a two or three speed AC motor to minimize the capacity needed from the DC power supply 105. A DC fan could also be used.

The fan 108 pulls fresh air 109 through a filter 110 (preferably replaceable) located at the fresh air inlet port 111 and through a duct 112 to the low-pressure side 113 of the fan 108. Air exits the high pressure side 114 of the fan 108 and passes through both the main side air input duct 115 and the waste side input duct 116 which are connected to the main side heat exchanger 103 and the waste side heat exchanger 104 respectively. Advantageously, to maximize the performance of the appliance and the comfort to the user, the air flow through the main side should be approximately 5 to 10 CFM while that on the waste side should be somewhat more, preferably from 1.5 to 3 times the main flow. The air flow from the waste side heat exchanger 104 passes through the waste side output duct 117, exiting the appliance at the waste outlet port 118, preferably pointing away from both the fresh air port 111 and the main outlet port 119. The waste may also be vented outside, to another room, or into a crawl or attic space, or the like. The airflow from the main side heat exchanger 103 passes through the main side output duct 120 and through a flow-directing device 121 such as one with adjustable louvers or one with fixed vanes within a ball directionally adjustable in socket, as examples.

As air passes through the main side heat exchanger 103, its temperature is changed from that of the air entering by the amount and in the direction as selected by the user controls 106. As air passes through the waste side heat exchanger 104, its temperature is changed in the opposite direction. Thus, the temperature of the air exiting the main side is cooler if the user has selected cooling mode, and warmer if the heating mode is selected with the amount of temperature differential determined by the user's selection of high or low. As shown, the adjustment of the amount of temperature change has only two discrete levels. Any number of discrete levels may be used, or the adjustment may be continuous. This control may also be combined with the on/off switch into a physically single control.

Preferably, the ducts 112, 115, 116, 117, and 120 are made of thermally insulative material. As shown in FIG. 1, they are separate parts. They are advantageously constructed from one or more insulative inserts shaped to provide necessary ducts along with cavities in which the fan assembly, the TE module with the heat exchangers, and the flow-directing device may rest.

Figure 2:
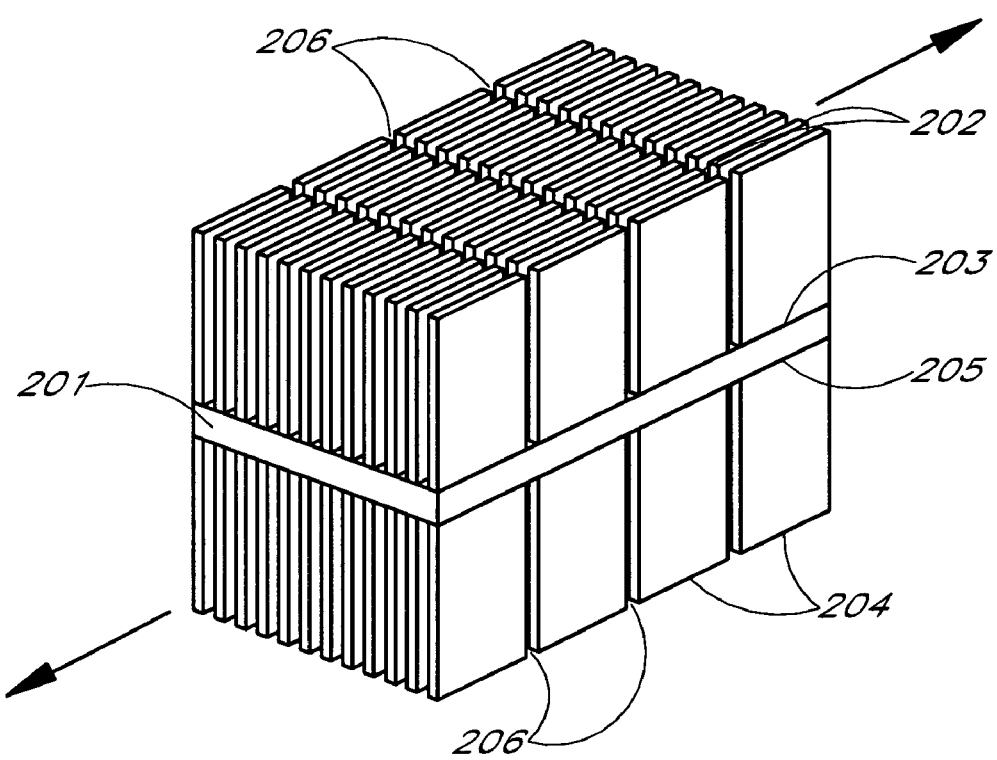
FIG. 2 illustrates the thermoelectric device and heat exchanger portion of the thermoelectric personal environment appliance in which thermal isolation in the direction of flow is employed to improve performance and efficiency.

The performance of the personal environment appliance may be improved by modifications to the thermoelectric module and heat exchanger portion as shown in FIG. 2. This modification is to provide thermal isolation in the direction of flow as described in U.S. patent application Ser. No. 09/844,818, filed on Apr. 27, 2001, published as U.S. patent application Publication No. US2002/0139123 A1 on Oct. 3, 2002, and issued as U.S. Pat. No. 6,539,725 on Apr. 1, 2003. This patent application is incorporated by reference herein.

The thermoelectric module 201 is in good thermal contact with a plurality of heat exchangers 202 on its main side 203 and in good thermal contact with a plurality of heat exchangers 204 on its waste side 205. As shown in FIG. 2, the heat exchangers are fin structures. Other types of heat exchangers can be used instead. The good thermal contact with the thermoelectric module is achieved with thermal grease or with thermally conductive glue. If grease is used, it is necessary to provide a clamping force holding the heat exchangers 202 and 204 firmly against the TE module 201. The heat exchangers 202 on the main side 203 are separated from each other by gaps 206 as are the heat exchangers 204 on the waste side 205. The main 203 and waste 205 sides of the TE module 201 are typically made of a ceramic material. Because of the sufficiently low thermal conductivity of the sides 203 and 205 of the TE module 201, along with the presence of the gaps 206, an acceptable amount of thermal isolation from one heat exchanger to the next is achieved. The arrows in the diagram show the flow direction. Preferably the flow is counter-flow with the main and waste flows in opposite directions. However, this is not necessary, and flow from the same direction is also possible.

The personal environment appliance 101 may be configured to be situated within the work area in a variety of ways. For example, it may simply rest on a work surface, in which case the air inlet advantageously is at the bottom, with the bottom surface raised from the work surface to allow air to enter. As another example, the appliance may be suspended from a work surface such as a bookshelf by means of a slot, located below, but near the upper surface of the appliance, which hooks over a portion of the shelf. In such configuration, the air intake would be on the bottom of the appliance. As yet another example, mounting holes or mounting brackets could be supplied serving to permanently attach the appliance to a convenient surface in the work area.

Figure 3:
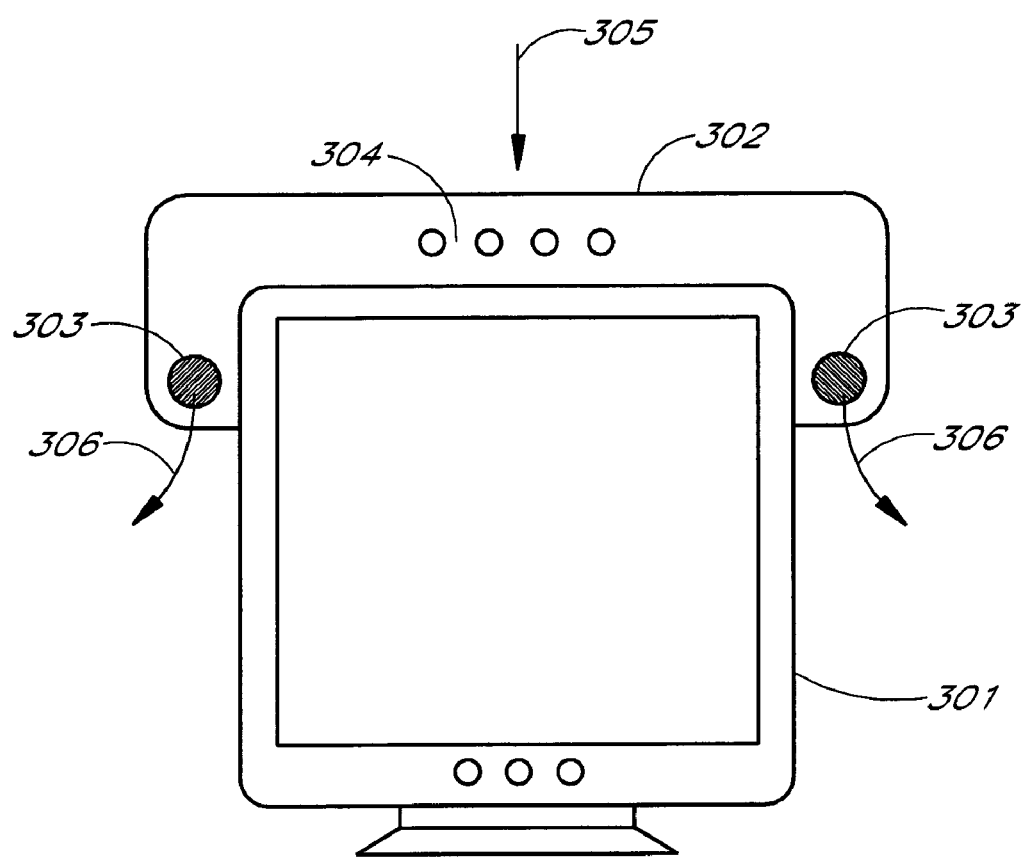
FIG. 3 illustrates a thermoelectric personal environment appliance on a computer monitor.

Another example is to configure the housing and the internal organization of the appliance to mount on and around the periphery of a computer monitor. FIG. 3 shows such a device. The personal environment appliance 302 rests on top of the computer monitor 301 and, as shown, has the main outlet ports 303 to the side of the monitor. User controls 304 are conveniently located above the top of the monitor 301 on the front face of the appliance 302. In this example, air 305 enters at the top of the appliance 302. Conditioned air 306 exits to the front from the main outlet ports 303 while waste air exits out the back (not shown) in this embodiment. Waste air could be directed to another area in another embodiment. In one embodiment, an anti-glare screen could be provided with the appliance to cover the computer screen.

Figure 4:
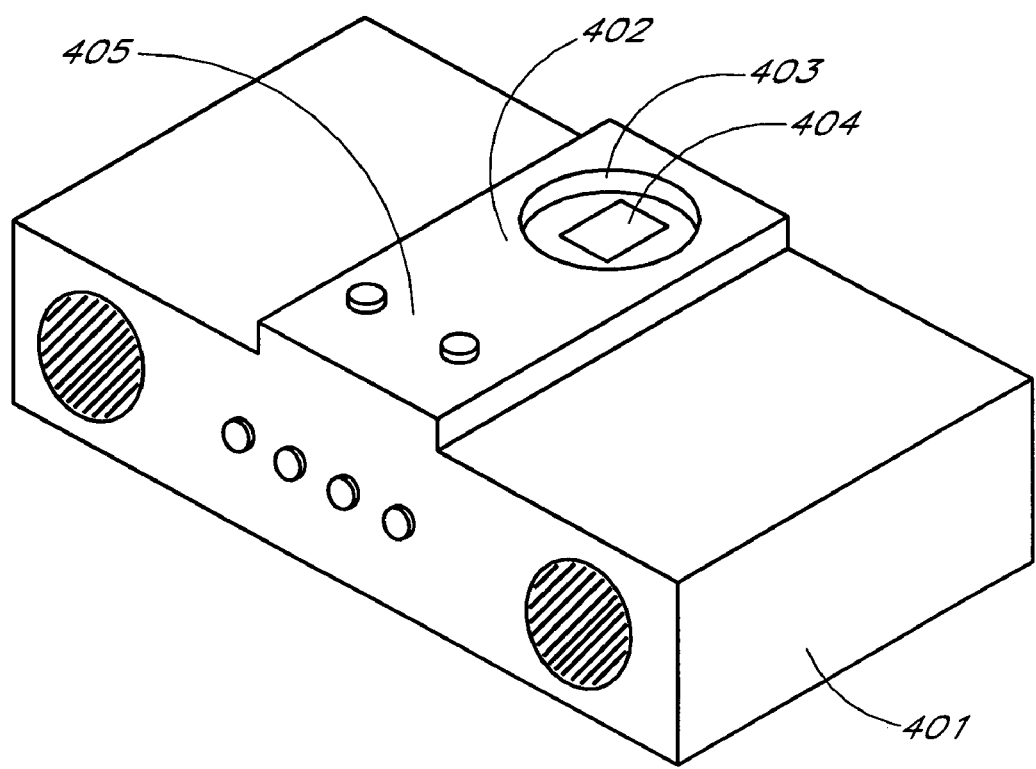
FIG. 4 illustrates the addition of a beverage cooler and heater to the thermoelectric personal environment appliance.

Other features may be added to the thermoelectric personal environment appliance. In the examples of the appliance suspended from or attached to work place furniture, in one embodiment, a light is added to provide illumination of a work surface below the appliance. Preferably, the light is fluorescent to minimize heat generation and provide diffused light. FIG. 4 shows the addition of a beverage heater and cooler. The housing 301 is modified to include, as an example, the platform 402 within which is a substantially circular recess 403 sized to fit typical cups, mugs, or cans. Within the recess 403 is a thermoelectric module 404. Within the housing 401, and attached to the underside of the thermoelectric module 404 is a heat exchanger (not shown) located so that the waste air pathways (suitably modified) include the heat exchanger. User operable controls 405 for choosing heating or cooling and for the amount of the chosen heating or cooling are located on, or protrude from the housing 401. The beverage heater/cooler portion of the appliance can be powered by the same power supply as powers the climate control portion or it can be separate.

The use of sound machines is well known to be beneficial in producing a calming and pleasant environment. The fan of the personal environmental appliance disclosed above produces a slight noise and, by suitable design, can be adjusted in amplitude and character. In addition, speakers may be added to the appliance to generate sound from an external signal source such as a computer CDROM drive and sound card. The speakers are powered either by the power supply 105 or by an external supply. The speakers or yet a separate sound system may be added to cancel unwanted noise either from the environment or noise emanating from the device itself. These configurations can be within the framework of those described above or can be integrated with a configuration designed to be mounted on a computer monitor as shown in FIG. 3 modified to extend the side arms enough to accommodate the speakers.

By taking advantage of the presence of the thermoelectric cooling present in the appliance, a small refrigerator may be added. In operation for personal heating or cooling, cool air is always generated whether on the main or the waste side. A portion of this air may be routed to an insulated box suitable for holding a small quantity of food or beverages, augmenting the number of thermoelectric elements and the capacity of the DC power supply as needed to supply the additional cooling required. In this configuration, the user controls are configured to allow the user to control the personal heating and cooling as desired while leaving the refrigerator running. To route cool air to the refrigerator regardless of the state of the heat/cool control, an electrically operated valve or vane, for example, is operated in response to the heat/cool switch setting to obtain the cool air from the proper duct. When the user has turned off the personal heating or cooling, the thermoelectric module and fan are under the control of a standby circuit by which the proper amount of air circulation and power to the TE module are determined and adjusted on the basis of a temperature measurement, by a thermistor, for example, of the refrigerator compartment.

A workspace or work area organizer feature may be added to the appliance. For example, this is an appendage to the housing with compartments for writing implements, memo pads, and other materials commonly found in the work place.

Figure 5:
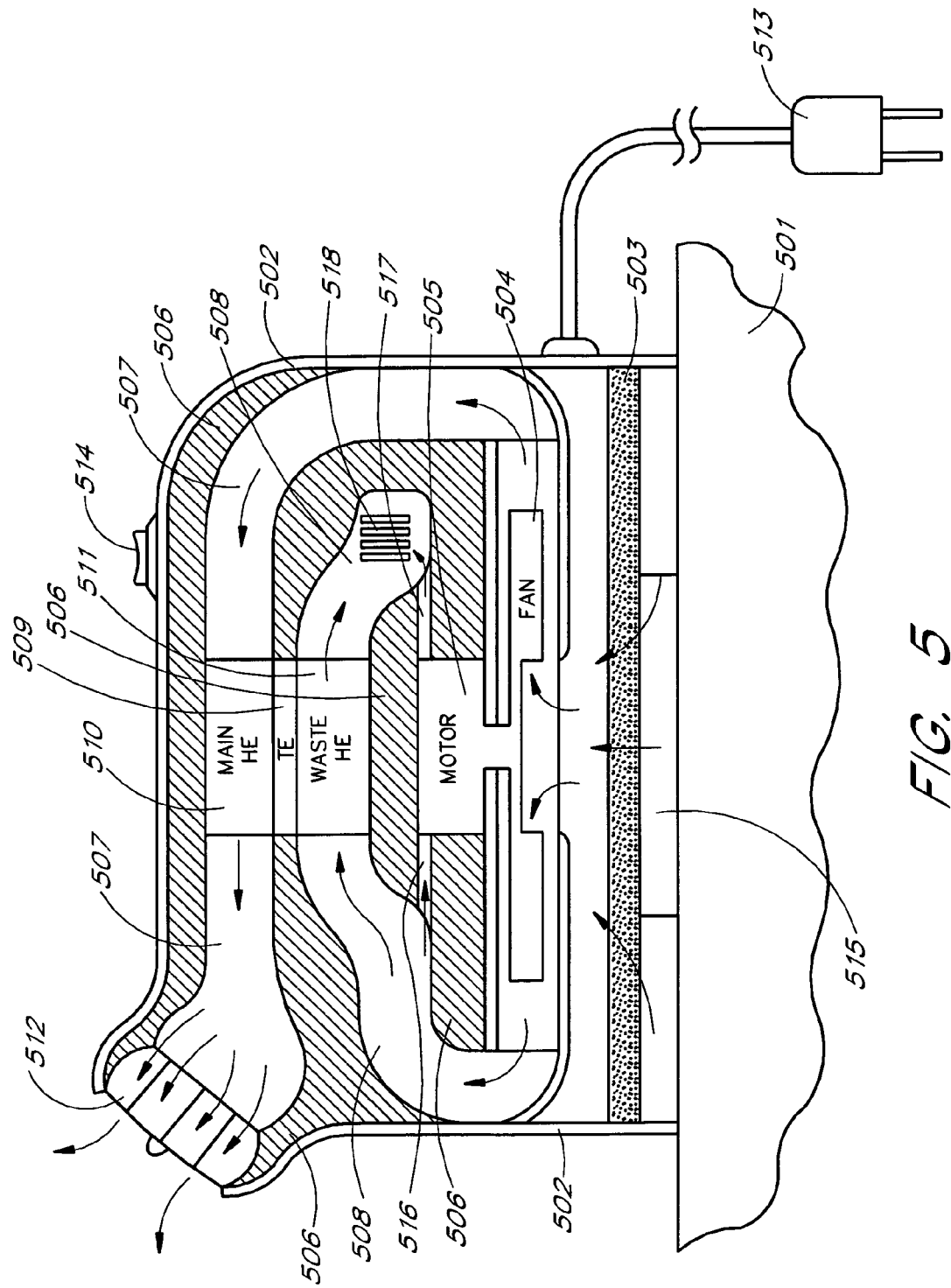
FIG. 5 depicts one embodiment of a thermoelectric personal environment appliance intended for use on a surface.

FIG. 5 depicts another particular embodiment, in cross section, of a thermoelectric personal environment appliance designed to be placed on a work or other surface 501. A housing 502 encloses an optional filter 503 (preferably replaceable), a fan 504 with fan motor 505, several inserts 506, together forming main side duct 507 and waste side duct 508. Advantageously, the inserts are insulative. A thermoelectric module 509 is located between the main side duct 507 and the waste side duct 508 and is in good thermal contact with a main side heat exchanger 510 residing within the main side duct 507 and a waste side heat exchanger 511 residing within the waste side duct 508. Preferably, a flow director 512 is positioned within the left hand end of the main side duct 507 as shown in the figure. Electricity to power the thermoelectric device 509 and the fan motor 505 is supplied from AC power through cord and wall plug 513. User operable controls 514 allow the user to choose on/off, cool/heat, and high/low.

Air enters the housing at its base through one or more ports 515 in the housing 502. The air passes through the filter 503, being drawn in by the fan 504. The air leaving the fan enters the main side duct 507 and the waste side duct 508 so as to pass through the main side heat exchanger 510 and the waste side heat exchanger 511 in opposite directions as shown. By rearrangement of the ducts 507 and 508, the flow can also be in the same direction. Advantageously, the assembly consisting of the thermoelectric module 509, the main side heat exchanger 510, and the waste side heat exchanger 511 are constructed with thermal isolation in the direction of flow as described above in FIG. 2.

A small motor cooling duct 516 leads off the waste side duct 558 prior to its entrance to the waste side heat exchanger 511 and supplies air to cool the motor 505. After passing around the motor 505, the air leaves the motor cavity via another small motor air exit duct 517 that rejoins the waste side duct 508 after the waste side heat exchanger 511. All of the air passing through the waste side duct 508 is expelled from the device through vents 518 positioned advantageously to direct the air away from the side of the device where the flow director 512 is located. As shown in FIG. 5, that direction is normal to the plane of the cross-section.

Air within the main side duct 507 passes through the main side heat exchanger 510 where it is cooled or heated according to the setting of the user operable controls 514. Air leaving the main side heat exchanger 510 passes through the flow director 512 that the user may adjust to direct the flow according to desires.

Preferably, the fan motor 505 is a two speed, AC fan and the DC for the thermoelectric module 509 is produced from the AC according to methods known in the art, such as full wave (user operable controls 514 set to high) or half wave (user operable controls 514 set to low) rectification without the need for filtering.

Several filtration systems can be used to improve the quality of air conditioned by the appliance in all the configurations of the present invention. Electrostatic filtration is well known to the art and can be incorporated in either the stream of the conditioned air or within the inlet so that both the conditioned and waste air are filtered. Alternately, electrostatic filtration may be used for the same purposes. Organic vapors and other contaminants can be removed by incorporating an absorptive filter medium such as an activated charcoal, or a combination of several media with complementary absorptive properties. Alternately, humidity, air freshening aromas, cleansing agents, disinfectants and/or other air modifiers can be added to the air streams to improve system functionality. The filter may also include ionic functionality The conditioned air can be controlled in any of the devices herein in several ways. The air can be guided so as to sweep periodically through an angle, such as by automatically swiveling the nozzle back and forth. The outlet can be provided with the capability of focus in the conditioned air into a narrow angle, or dispersed over a broad angle by incorporating a suitable diffuser mechanism into the nozzle, for example as has been done in some aircraft passenger ventilator systems. Provisions can be designed to allow the air output direction to be manually adjusted.

In some circumstances, it may be desirable for the appliance to operate during a specific period of time, or to turn itself off after a given amount of time has elapsed. To provide this capability, a timer control mechanism including a clock is incorporated into the appliance control system 106. A user either sets the times the appliance is to start and stop, or alternately, the user sets the length of time the appliance is to operate, with the appliance turning itself off when the specified time has elapsed.

As an additional feature, a clock and alarm is incorporated into the appliance. An additional configuration of the appliance is to integrate the appliance into the base of a freestanding desk lamp, combining the functionality of the two devices. Various configurations of the appliance could be integrated in this manner.

Although various specific embodiments of the present invention have been disclosed, the embodiments are not intended to limit, but only illustrate examples of the present invention. Accordingly, many other configurations and uses are possible. Accordingly, the inventions are not limited to any particular embodiment, or specific disclosure. Rather, the inventions are defined by the appended claims, in which terms are presented to have their ordinary and accustomed meaning.

What is claimed is:

1. A personal environment appliance that provides heating and/or cooling in a localized area, the personal environment appliance comprising:
   at least one electric motor driving at least one fan;
   at least one inlet air path to a low pressure side of the at least one fan;
   a thermoelectric device having a first side and a second side;
   a first plurality of fin heat exchangers in thermal communication with the first side of the thermoelectric device, wherein inlet air passes the first plurality of fin heat exchangers along a first direction of flow and changes temperature, the first plurality of fin heat exchangers substantially thermally isolated from one another in the first direction; and
   at least one outlet for the air that has passed the first plurality of fin heat exchangers to provide temperature control of the localized area.

2. The personal environment appliance of claim 1, wherein the at least one inlet air path is formed by an insulative member.

3. The personal environment appliance of claim 1, further comprising at least one air filter.

4. The personal environment appliance of claim 3, wherein the air filter comprises an electrostatic filter.

5. The personal environment appliance of claim 3, wherein the air filter comprises activated charcoal.

6. The personal environment appliance of claim 1, further comprising at least one flow directing device for the at least one outlet.

7. The personal environment appliance of claim 1, further comprising at least one AC to DC power supply.

8. The personal environment appliance of claim 1, wherein the appliance is constructed to rest on a surface.

9. A personal environment appliance that provides heating and/or cooling in a localized area, the personal environment appliance comprising:
   at least one electric motor driving at least one fan;
   at least one inlet air path to a low pressure side of the at least one fan;
   a thermoelectric device having a first side and a second side;
   a first plurality of fin heat exchangers in thermal communication with the first side of the thermoelectric device, wherein inlet air passes the first plurality of fin heat exchangers along a first direction of flow and changes temperature, the first plurality of fin heat exchangers substantially thermally isolated from one another in the first direction;
   at least one outlet for the air that has passed the first plurality of fin heat exchangers to provide temperature control of the localized area; and
   a second plurality of fin heat exchangers in thermal communication with the second side of the thermoelectric device, wherein waste air passes the second plurality of fin heat exchangers along a second direction of flow and changes temperature, the second plurality of fin heat exchangers separated from one another in the second direction of flow by gaps.

10. The personal environment appliance of claim 9, wherein the first direction of flow and the second direction of flow are in opposite directions.

* * * * *